(12) United States Patent
Ten Kate

(10) Patent No.: US 7,230,673 B2
(45) Date of Patent: Jun. 12, 2007

(54) LITHOGRAPHIC APPARATUS, RETICLE EXCHANGE UNIT AND DEVICE MANUFACTURING METHOD

(75) Inventor: Nicolaas Ten Kate, Almkerk (NL)

(73) Assignee: ASML Netherlands B.V., Veldhoven (NL)

( * ) Notice: Subject to any disclaimer, the term of this patent is extended or adjusted under 35 U.S.C. 154(b) by 93 days.

(21) Appl. No.: 11/005,220

(22) Filed: Dec. 7, 2004

(65) Prior Publication Data

US 2006/0119808 A1    Jun. 8, 2006

(51) Int. Cl.
G03B 27/52 (2006.01)
G03B 27/42 (2006.01)

(52) U.S. Cl. .......................................... 355/30; 355/53

(58) Field of Classification Search .................. 355/30, 355/53, 73
See application file for complete search history.

(56) References Cited

U.S. PATENT DOCUMENTS

| 6,507,390 B1 | 1/2003 | Ivaldi | |
|---|---|---|---|
| 2002/0126269 A1* | 9/2002 | Sato | 355/77 |
| 2003/0136512 A1 | 7/2003 | Yamamoto | |
| 2003/0150329 A1* | 8/2003 | Kamono | 95/291 |

FOREIGN PATENT DOCUMENTS

| EP | 0 266 760 B1 | 9/1993 |
|---|---|---|
| EP | 1 434 094 A1 | 6/2004 |
| JP | 2003280176 A | 10/2003 |

OTHER PUBLICATIONS

Korean Office Action issued for Korean Application No. 10-2005-0118337, dated Oct. 30, 2006.

* cited by examiner

*Primary Examiner*—Henry Hung Nguyen
*Assistant Examiner*—Marissa A. Ohira
(74) *Attorney, Agent, or Firm*—Pillsbury Winthrop Shaw Pittman LLP

(57) ABSTRACT

A reticle exchange unit for moving a reticle in a lithographic apparatus is disclosed. The surface of the reticle is protected by a pellicle attached thereto by a gas permeable pellicle frame. The reticle exchange unit includes a reticle preparation chamber, a reticle transport unit arranged to cause a plurality of exposed gas permeable parts of the pellicle frame to face an interior of the reticle preparation chamber, and a purge gas pressure and evacuating pressure supply arrangement coupled to the reticle preparation chamber and arranged to provide, alternately, a purge gas pressure and evacuating pressure that is lower than the purge gas pressure to the reticle preparation chamber when the exposed gas permeable parts of the pellicle frame are facing the interior of the reticle preparation chamber, so that gas flows through the pellicle frame, alternately, into and out of a pellicle space between the pellicle and the reticle.

17 Claims, 3 Drawing Sheets

LITHOGRAPHIC APPARATUS, RETICLE EXCHANGE UNIT AND DEVICE MANUFACTURING METHOD

FIELD

The present invention relates to a lithographic apparatus, a reticle exchange unit, and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction), while synchronously scanning the substrate parallel or anti-parallel to this direction.

The reticle (also called mask) may be reflective or transmissive. A reflective reticle reflects a patterned version of the projection beam and the reflected beam is directed to the substrate. A transmissive reticle transmits a patterned version of the projection beam and the transmitted beam is directed to the substrate. The reticle often contains a glass plate, on one side of which the pattern is provided, e.g. in the form of a patterned Chromium layer. To protect the patterned surface of the reticle, a pellicle (which is made of a transparent material in the form of a thin foil or a thin glass plate, for example) is provided, which covers the patterned surface of the reticle. The pellicle is attached to the reticle using a frame that connects to the edges of the pellicle, leaving a pellicle space free. This frame will be called the pellicle frame.

U.S. Pat. No. 6,507,390 discloses a pellicle-reticle-frame assembly in which the pellicle frame is porous, thereby permitting an inert purge gas to flow into and out of the pellicle space. Alternatively, holes may be provided in the pellicle frame to permit the flow of purge gas. Purging of spaces surrounding optical equipment is a standard procedure. During conventional purging, a steady flow of an inert gas is maintained to drive out unwanted gases.

U.S. Pat. No. 6,507,390 describes how the pellicle-reticle-frame assembly can be purged in preparation of use. This is often done each time before the reticle is loaded into the reticle stage of the photolithographic apparatus, shortly before the reticle will be used during exposure of the substrate. The pellicle-reticle-frame assembly is placed in a box in which purge gas flow is realized through the pellicle space in parallel with the surface of the reticle and the pellicle. A purge gas supply and a vacuum source are mounted near the edges of the pellicle frame on mutually opposite sides of the pellicle space. Purge gas flows from one edge to the other between the pellicle and the reticle.

The pellicle is a flimsy structure that is often prone to damage. Therefore, direct (accidental) contact between the pellicle and the outlets of the purge gas supply and the vacuum source should be avoided. Nevertheless, these outlets should be located as close as possible to the edges of the pellicle frame to minimize loss of gas that does not flow through the pellicle space. This often requires the overhead of accurate positioning equipment. When the pellicle size and shape are different for different reticles, careful adaptation should be used.

Another problem with the purge gas flow approach is that contaminants, like water, that are adsorbed to pores of the pellicle frame on the side of the purge gas supply flow into the pellicle space and are often removed through the pellicle frame on the side of the vacuum source, where they may again be adsorbed to the pellicle frame. This may extend the time that a purge flow is needed. Particles blown into the pellicle space from the pellicle frame may get attached to the reticle, often making the reticle useless.

A further problem with the purge gas flow from one side of the pellicle to the other is that different dynamic forces may be generated on different sides of the attachment to the pellicle frame, which may lead to deformation and a spatial relation between the pellicle and the reticle.

SUMMARY

Among others, it is an aspect of the invention to realize a method of providing clean inert gas in the pellicle space with reduced risk of damage due to positioning of the vacuum source or gas supply. It is also an aspect of the invention to provide for a photolithographic apparatus that supports such method.

Among others, it is an aspect of the invention to realize a method of providing clean inert gas in the pellicle space so that adsorbed contaminants pass through the pellicle space to a lesser extent.

Among others, it is an aspect of the invention to reduce the risk of particles being blown into pellicle space.

Among others, it is an aspect of the invention to reduce the risk of local reticle deformation due to forces caused by purging.

According to an embodiment of the invention, there is provided a lithographic apparatus. The lithographic apparatus includes an illumination system for conditioning a beam of radiation, and a support for supporting a reticle. The reticle serves to impart the beam of radiation with a pattern in its cross-section. A surface of the reticle is protected by a pellicle attached thereto by a gas permeable pellicle frame. The apparatus also includes a reticle exchange unit that includes a reticle preparation chamber, and a reticle transport unit that is arranged to cause a plurality of exposed gas permeable parts of the pellicle frame to face an interior of the reticle preparation chamber before moving the reticle to the support. The reticle exchange unit also includes a purge gas pressure and evacuating pressure supply arrangement arranged to provide, alternately, a purge gas pressure and evacuating pressure that is lower than the purge gas pressure to the reticle preparation chamber when the exposed gas permeable parts of the pellicle frame are facing the interior of the reticle preparation chamber, so that gas flows through the pellicle frame, alternately, into and out of a pellicle space between the pellicle and the reticle.

According to an embodiment of the invention, there is provided a device manufacturing method. The device manufacturing method includes conditioning a beam of radiation, and moving a reticle to a position for imparting the beam of radiation with a pattern in its cross-section. The reticle has a surface that is protected by a pellicle attached to the reticle by a gas permeable pellicle frame. The method also includes projecting the patterned beam of radiation onto a target portion of a substrate, placing the reticle relative to a reticle preparation chamber so that a plurality of exposed gas permeable parts of the pellicle frame face an interior of the reticle preparation chamber before the reticle is moved to the position for imparting the beam of radiation with the pattern, and alternately applying a purge gas pressure and evacuating pressure that is lower than the purge gas pressure to the reticle preparation chamber when the exposed gas permeable parts of the pellicle frame are facing the interior of the reticle preparation chamber, so that gas flows through the pellicle frame, alternately, into and out of a pellicle space between the pellicle and the reticle.

According to an embodiment of the invention, there is provided a reticle exchange unit for use in a lithographic apparatus. The surface of the reticle is protected by a pellicle attached thereto by a gas permeable pellicle frame. The reticle exchange unit includes a reticle preparation chamber, and a reticle transport unit arranged to cause a plurality of exposed gas permeable parts of the pellicle frame to face an interior of the reticle preparation chamber. The reticle exchange unit also includes a purge gas pressure and evacuating pressure supply arrangement coupled to the reticle preparation chamber and arranged to provide, alternately, a purge gas pressure and evacuating pressure that is lower than the purge gas pressure to the reticle preparation chamber when the exposed gas permeable parts of the pellicle frame are facing the interior of the reticle preparation chamber, so that gas flows through the pellicle frame, alternately, into and out of a pellicle space between the pellicle and the reticle.

According to an embodiment of the invention, the reticle-pellicle assembly is moved to a reticle preparation chamber before use. In the reticle preparation chamber, the pellicle space between the reticle and the pellicle is purged by alternate application of a vacuum and a purge gas to all exposed gas passages through the pellicle frame, so that, alternately, all gas flow is out of pellicle space and into pellicle space. As a result, no connections for simultaneous supply and removal of gas need to be provided close to the pellicle frame. This reduces the risk of damage to the pellicle. Also, material that was adsorbed to the pellicle frame need not move through pellicle space when it is removed during evacuation.

Furthermore, alternate application of vacuumizing and refilling allows the possibility of optimization for each step. In an embodiment, a higher gas velocity through the pellicle frame is created during evacuation than during refill. This may reduce the risk of particle deposition on the reticle pattern.

In a further embodiment, the reticle preparation chamber includes a flow reducing structure, also referred to as a flow reducer, that is operative to impede gas flow to and from a space adjacent an exposed surface of the pellicle. The flow reducing structure is used to prevent the development of a large pressure differential over the pellicle, thereby allowing fast evacuation and refilling of the reticle preparation chamber, and reducing overall purge time without increased risk of damage. It suffices that the flow reducing structure is present adjacent the exposed surface of the pellicle so that the movement of the pellicle along the plane of the pellicle does not entail the risk of collision with the flow reducing structure. Preferably, flow reducing structures are provided at least facing the part of the exposed surface of the pellicle where the pellicle is connected to the pellicle frame.

In a further embodiment, an exchangeable flow reducing structure is used. When a reticle is to be used, a matching flow reducing structure is selected, which has an extending surface (facing the pellicle) that has a size and shape of the pellicle at least in directions parallel to the exposed surface of the pellicle. Preferably, the exchangeable flow reducing structures are provided at least facing the part of the exposed surface of the pellicle where the pellicle is connected to the frame. A dummy reticle with a pellicle frame may be one of the possibilities.

In another embodiment, a sensor is arranged for measuring a pellicle deformation and/or pressure in the reticle preparation chamber during application of the evacuating and/or refilling pressure, and evacuation and/or refilling is controlled dependent on the measured pellicle deformation and/or pressure. In this way, excessive pressure difference across the pellicle may be avoided. In another embodiment, a rate and/or duration of the evacuating is set to below a predetermined rate and/or duration. In this way, excessive pressure difference across the pellicle may be avoided.

The reticle may be moved to the reticle preparation chamber while a preceding reticle is on the support structure to pattern the beam. Once the preceding reticle is no longer needed, it may be removed and the new reticle may moved from the reticle preparation chamber to a position in the beam. Subsequently, a new reticle may be moved to the reticle preparation chamber. In this way, a maximum time is available for exposure. Another feature of the reticle preparation chamber is that after purging, it may be used for a longer storage period as well. A small overpressure may be maintained to keep it clean.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate as used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The term "projection system" as used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
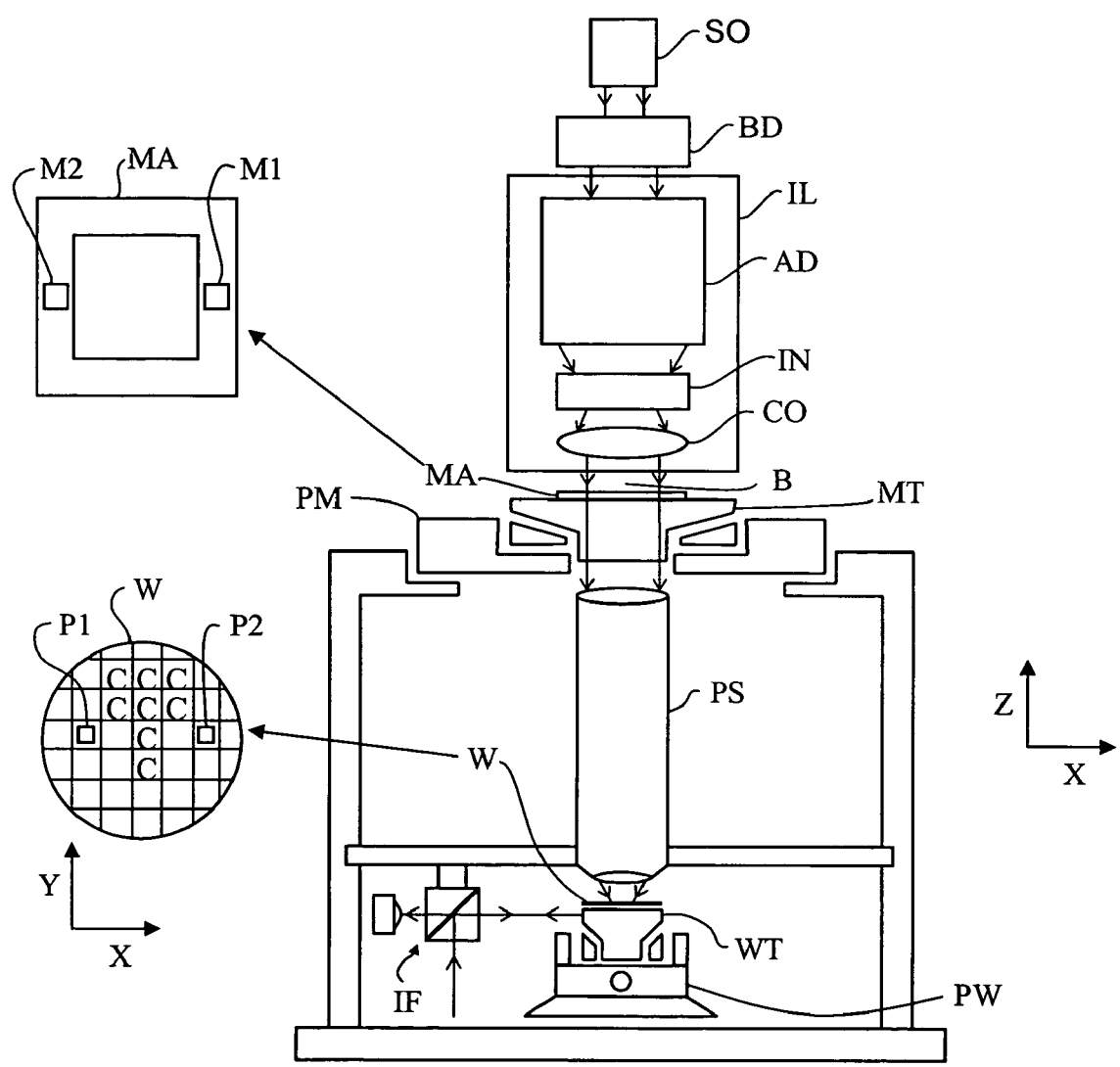
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam B of radiation (e.g. UV radiation); a first support structure (e.g. a mask table) MT for supporting a patterning device (e.g. a mask) MA and connected to a first positioner PM for accurately positioning the patterning device with respect to item PS; a substrate table (e.g. a wafer table) WT for holding a substrate (e.g. a resist-coated wafer) W and connected to a second positioner PW for accurately positioning the substrate with respect to item PS; and a projection system (e.g. a refractive projection lens) PS for imaging a pattern imparted to the projection beam B by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be integral part of the apparatus, for example, when the source is a mercury lamp. The source SO and the illuminator IL, together with the beam delivery system BD, if required, may be referred to as a radiation system.

The illuminator IL may include an adjustor AD for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the projection beam B, having a desired uniformity and intensity distribution in its cross-section.

The projection beam B is incident on the mask MA, which is held on the mask table MT. Having traversed the mask MA, the projection beam B passes through the lens PS, which focuses the beam onto a target portion C of the substrate W. With the aid of the second positioner PW and position sensor IF (e.g. an interferometric device), the substrate table WT can be moved accurately, e.g. so as to position different target portions C in the path of the beam B. Similarly, the first positioner PM and another position sensor (which is not explicitly depicted in FIG. 1) can be used to accurately position the mask MA with respect to the path of the beam B, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following example modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally, a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array.

Combinations and/or variations on the above described modes of use or entirely different modes of use may also be employed.

As an alternative, a reflective design may be used, in which the projection beam B is patterned by means of a reflective patterning device. The term "reticle" will be used herein to cover both structures for transmissive and reflective patterning.

Figure 2:
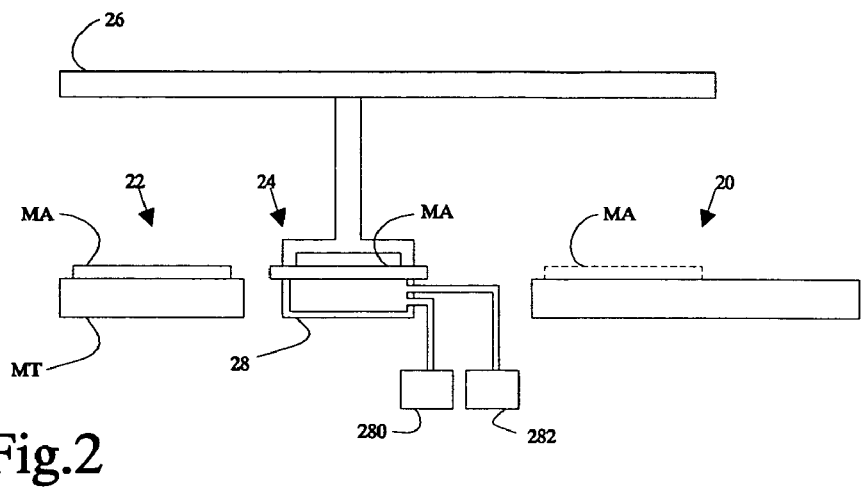
FIG. 2 schematically depicts an embodiment of a reticle exchange unit.

FIG. 2 schematically shows elements of an embodiment of a reticle exchange unit. The reticle exchange unit contains a reticle transport unit 26, a reticle preparation chamber, represented by box structure 28, a control circuit (not shown), and a connection to a vacuum source 280 and to a purge gas source 282. The reticle exchange unit serves three stations 20, 22, 24 for placement of reticles. Transport unit 26 transports reticles between the stations. The patterned surface of reticles MA is directed downward in the figure. A first station 20 serves to supply reticles MA from a multi-reticle storage device (not shown). A second station 22 corresponds to mask table MT, on which reticle MA is supported for use during exposure of substrate W. A third station 24 serves for purging. The third station contains a reticle preparation chamber 28 which is open at the top, so that reticle MT can be made to form a top closure of reticle preparation chamber 28. Reticle preparation chamber 28 is coupled to a vacuum source 280 and a purge gas source 282. Transport unit 26 contains, for example, a rotatable disk to which a robot arm for gripping the reticles is attached.

Typically, the reticle exchange unit is structured as a modular unit that can be inserted in the photolithographic apparatus and linked to the control computer (not shown) of the photolithographic apparatus, as well as to various support units such as vacuum source 280 and purge gas source 282.

Figure 3:
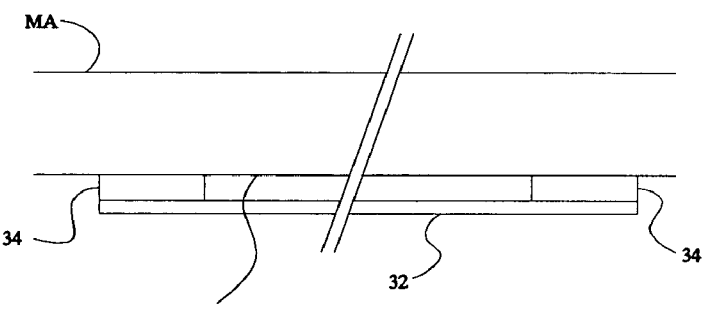
FIG. 3 schematically depicts an embodiment of a reticle-frame-pellicle assembly.

FIG. 3 shows part of a reticle-pellicle-frame assembly in more detail (not to scale). On top reticle MA is shown, with its patterned surface 30 facing downward. Below this surface is a pellicle 32, e.g. in the form of a thin foil or a thin glass plate, which is attached to reticle MA at the edges of pellicle 32 with a pellicle frame 34. Pellicle frame 34 is porous.

Figure 4:
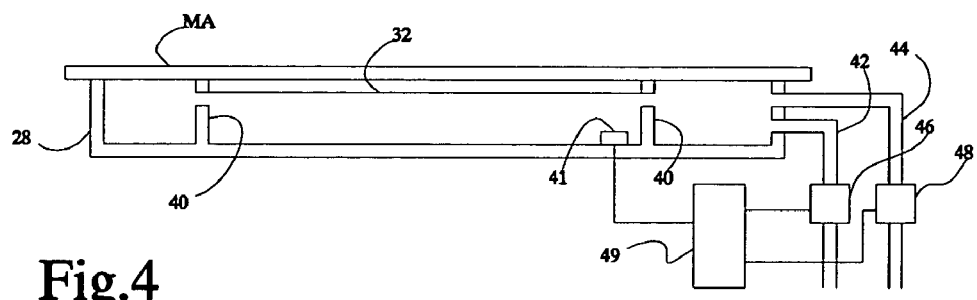
FIGS. 4 and 4*a* schematically depict an embodiment of a reticle preparation chamber.

FIG. 4 shows reticle preparation chamber 28 in more detail. On top reticle MA is shown. Connections 42, 44 to the vacuum source (not shown) and the purge gas supply (not shown) are provided with controllable valves 46, 48. A control circuit 49 is provided to control valves 46, 48. The control circuit 49 includes, for example, a suitably programmed computer (not shown), which may also be used to control other functions, such as transport of the reticle MA. The computer has output connections coupled to valves 46, 48, and is programmed to make valves 46 and 48 open and close, as described below. Alternatively, a dedicated circuit with timers may be used to realize opening and closing at the described times, or a sensor circuit may be used to control opening and closing. An optional sensor 41 is shown coupled to control circuit 49. Inside reticle preparation chamber 28, gas flow obstructions 40 facing the surface of pellicle 32 are provided. Such gas flow obstructions may also be referred to as gas flow reducing structures or gas flow reducers. The distance between obstructions 40 and the surface of pellicle 32 has been exaggerated in FIG. 4. In an embodiment, obstructions 40 extend so close to the surface of pellicle 32 that gas flow between pellicle 32 and obstructions 40 is significantly obstructed. Optional sensor 41 is located between obstructions 40.

Figure 4A:
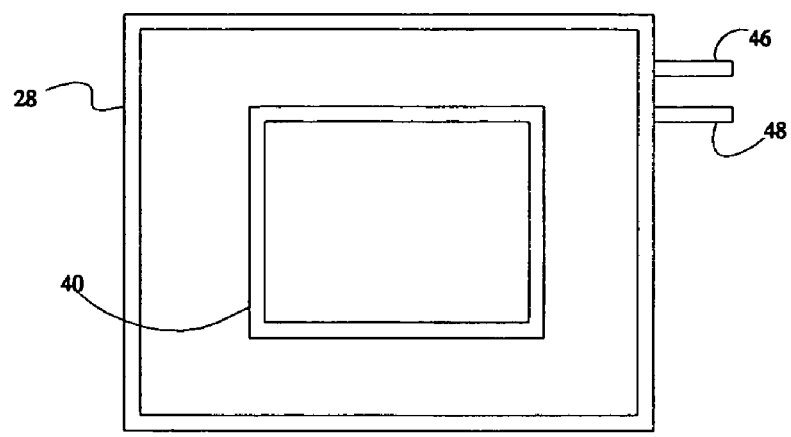

FIG. 4a shows a top view of reticle preparation chamber 28. As can be seen, obstructions 40 do not run from wall to wall of reticle preparation chamber 28. Obstructions substantially follow the outline of pellicle frame 34, thereby allowing unobstructed gas flow around the pellicle frame, while obstructing, but not necessarily completely blocking, gas flow between the outside of the pellicle frame and the region below the surface of pellicle 32.

In operation, while a first reticle MA is supported on mask table MT and used for patterning projection beam B, a second reticle MA, which will be used to replace the first reticle MA on the mask table during future exposure operations, is moved from the reticle storage device (not shown) to the first loading station. Transport unit 26, which is, for example, a disk with gripper arms attached to it, is used to pick up the second reticle MA from first loading station 20 and to push reticle MA against the edges of reticle preparation chamber 28. This is the situation shown in FIG. 2.

While second reticle MA is pushed against reticle preparation chamber 28, control circuit 49 causes valves 46, 48 to be opened alternately, so that reticle preparation chamber 28 is alternately coupled to vacuum source 280 and purge gas supply 282. In an embodiment, instead of using controllable valves 46, 48, a pump connected to the reticle preparation chamber 28 may be used, the pump being activated and deactivated, instead of opening and closing the valves, to apply or remove pressure. As a result of alternate opening of valves 46, 48, the surrounding space in reticle preparation chamber 28 surrounding obstruction 40 is alternately evacuated and filled with purge gas. When this surrounding space is evacuated, gas flows from the pellicle space between surface 30 of reticle MA and pellicle 32 through porous pellicle frame 34 on all sides of pellicle 32. When purge gas is supplied to this surrounding space, gas flows to the pellicle space between surface 30 of reticle MA and pellicle 32 through porous pellicle frame 34 on all sides of pellicle 32. Evacuation and supply of purge gas is repeated a number of times, e.g. one, two, or three times, depending on the available vacuum and purge gas supply sources, and target contaminant levels. The result is that unwanted gasses (non-purge gases) are substantially removed from the pellicle space.

When it is time to replace the reticle MA from mask table MT, transport unit 26 moves this reticle to first station 20 for further transport to the reticle storage device (not shown). After a final supply of purge gas, transport unit then picks up the reticle MA from reticle preparation chamber 28 and moves this reticle to mask table MT. The outgoing and incoming reticles are preferably transported simultaneously to save time.

Due to obstructions 40, gas pressure in the contained space surrounded by obstructions 40 drops more slowly than pressure in the surrounding space. As a result, deformation of pellicle 32 due to pressure differences between the gas in the pellicle space and the contained space are reduced. It has been found that small deformations of pellicle 32 can be tolerated. It should be noted that obstructions 40 nowhere extend so far that a lateral movement of reticle MA could bring pellicle 32 into contact with obstructions.

Various measures may be taken to provide further protection against deformation of the pellicle. In an optional embodiment that is illustrated in FIG. 4, optional sensor 41 is a pressure sensor that is used to measure the pressure in the contained space surrounded by obstructions 40. Control circuit 49 is arranged to close the valve 46 leading to the vacuum source if the measured pressure drops below a threshold pressure value at which pellicle 32 is predicted to deform by more than an acceptable amount. Typically, the threshold pressure value varies as a function of time, according to the expected pressure drop in the pellicle space between the surface 30 of reticle MA and pellicle 32. A similar control method may be used during refilling.

In another embodiment, control circuit 49 is arranged to close valve 46 to the vacuum source at a predetermined time interval after opening that valve, and then to open valve 48 to the purge gas supply, so as to limit the size of the pressure drop that can develop by gas flow between pellicle 32 and obstructions 40. In yet another embodiment, valve 46 is adjustable so that it affects a rate of flow to the vacuum source. In this embodiment, control circuit 49 regulates the adjustment of valve 46 so that a predetermined rate of evacuation is realized that does not result in unacceptable deformation of pellicle 32. In yet another embodiment, sensor 41 is a displacement sensor for sensing displacement of a part of pellicle 32 to measure its deformation. In this embodiment, control circuit 49 is arranged to close valve 46 to the vacuum source when more than a threshold amount of displacement is detected. Control circuit 49 may also be arranged to control the valves upon commands from the operator.

Figure 5:
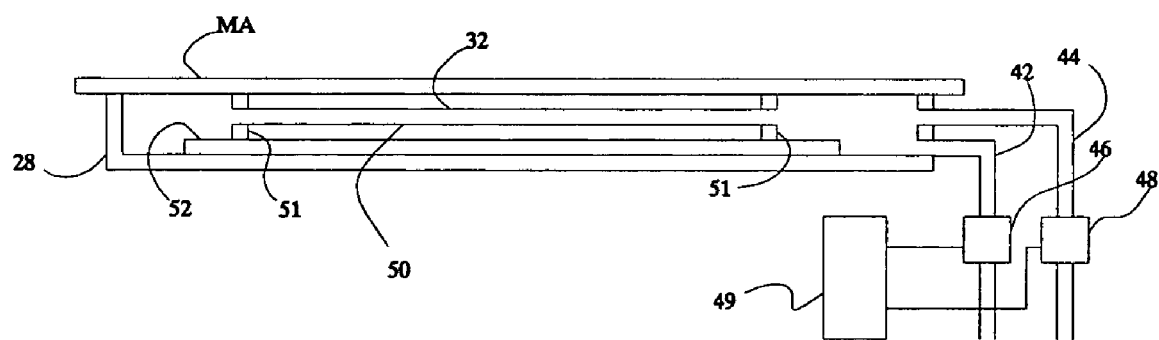
FIG. 5 schematically depicts another embodiment of a reticle preparation chamber.

FIG. 5 shows another embodiment of reticle preparation chamber 28. In this embodiment, obstructions 40 have been omitted and reticle preparation chamber 28 is provided with a mounting position for mounting a dummy reticle 52 that is provided with a dummy pellicle 50 of the same horizontal size and shape as the pellicle 32 of the real reticle MA. The vertical height at which dummy pellicle 50 is placed above dummy reticle 52 need not be the same as that of pellicle 32 above reticle MA. In operation, before transport unit 26 places reticle MA on top of reticle preparation chamber 28, a dummy reticle is selected which has a dummy pellicle of the horizontal size and shape of reticle MA. Transport unit 26 (or another transport device) places the selected dummy reticle 52 in reticle preparation chamber 28, with its dummy pellicle 50 facing upwards. Next, transport unit 26 places reticle MA on top of reticle preparation chamber 28, positioned so that the position of pellicle 32 and dummy pellicle 50 substantially coincides. Subsequently, the surrounding space in reticle preparation chamber 28 is alternately evacuated and filled with purge gas a number of times. Finally, reticle MA is moved to mask table MT for use during exposure.

In this embodiment, the height of dummy pellicle frame 51 is selected so that only a narrow space remains between pellicle frame 34 and dummy pellicle frame 51. This prevents large deformations of pellicle 32 due to evacuation and/or refilling of reticle preparation chamber 28.

While specific embodiments of the invention have been described above, it will be appreciated that the invention may be practiced otherwise than as described. The description is not intended to limit the invention. For example, instead of using reticle MA as lid of the box structure, a separate lid may be provided, the reticle MA being placed in the box before the lid is closed. Furthermore, although use of a vacuum source has been described, a low-pressure source may be used instead, which provides sufficiently low pressure in reticle preparation chamber 28 to cause flow of a significant amount of gas from pellicle space during the time intervals in which the reticle MA is exposed to this low pressure. Furthermore, although single connections of the vacuum source and purge gas supply to the chamber have been shown, it will be understood that in practice, multiple connections may be used. Also, although a unitary chamber has been shown, it will be understood that in practice, a chamber including a number of sub-chambers in gas-contact with the pellicle frame 34 of the reticle-pellicle assembly may be used, each chamber being evacuated at a time when the other chambers are evacuated and filled with purge gas at a time when the other chambers are filled with purge gas. Furthermore, although, preferably, all of porous pellicle frame is exposed to evacuating pressure and purge gas pressure, it will be understood that without deviating from the invention, part of the pellicle frame may be blocked out from changing gas pressure, so that no gas flows through these parts in either direction. This may reduce the overall flow rate into and out of the pellicle space, but does not affect the principle of operation. Instead of a porous pellicle frame, a pellicle frame with small holes in it may be used. This does not change the principle of operation.

Furthermore, although the invention has been described for the case in which the pellicle space of a reticle MA is purged on its way from the reticle storage to the support table MT, it will be understood that without deviating from the invention, the reticle may be moved from the support table for purging and back to the support table when the reticle is used for a long period. Furthermore, although preferably a reticle is purged while a preceding reticle is used for projecting a patterned beam, in another embodiment, the reticle may be purged after the preceding reticle has been removed, or at an earlier time, the purged reticle being moved to a purged storage space after processing in reticle preparation chamber 28 and before use. Furthermore, although in the embodiments, reticle MA is moved to press against reticle preparation chamber 28, alternatively, reticle preparation chamber 28 may be pressed against reticle MA, or if a low purge gas pressure is used, reticle MA may rest on reticle preparation chamber 28 without pressure.

Furthermore, although the invention has been described for one type of pellicle-reticle assembly, it will be understood that the invention can be applied to other types of assembly, such as a reticle with pellicles on two sides, or with a pellicle over the side away from the pattern on the reticle, as well as to an assembly with a pellicle over the side with the pattern on the reticle.

Preferably Nitrogen is used as a purge gas. In an embodiment, two purge gases are used, one lighter than the other (Helium and Nitrogen, for example, or Argon and Nitrogen). In this embodiment, the heavier purge gas is supplied to the box structure first, and subsequently it is slowly replaced by the lighter gas. The lighter gas will fill the box structure from top to bottom, thereby driving the heavier gas to an exhaust. As a result, a flow will arise that replaces the heavier gas in the pellicle space by the lighter gas. This step may be followed by the reintroduction of the heavier gas, thereby driving the lighter gas before it this time. In this way, a purging action may be realized by application of gas pressure, without the need to provide an inlet and outlet for a directed flow close to the pellicle. It will be appreciated that this technique can be applied with and without evacuation. When combined with evacuation, several gases are supplied between successive applications of the vacuum.

What is claimed is:

1. A lithographic apparatus comprising:
    an illumination system for conditioning a beam of radiation;
    a support for supporting a reticle, the reticle serving to impart the beam of radiation with a pattern in its cross-section, a surface of the reticle being protected by a pellicle attached thereto by a gas permeable pellicle frame;
    a reticle exchange unit comprising
        a reticle preparation chamber comprising a flow reducer, the flow reducer being constructed and arranged to obstruct gas flow to and from a space in the reticle preparation chamber that adjoins an exposed surface of the pellicle that faces away from the reticle;
        a reticle transport unit arranged to cause a plurality of exposed gas permeable parts of the pellicle frame to face an interior of the reticle preparation chamber before moving the reticle to the support; and
        a purge gas pressure and evacuating pressure supply arrangement arranged to provide, alternately, a purge gas pressure and an evacuating pressure that is lower than the purge gas pressure to the reticle preparation chamber when the exposed gas permeable parts of the pellicle frame are facing the interior of the reticle preparation chamber, so that gas flows through the pellicle frame, alternately, into and out of a pellicle space between the pellicle and the reticle.

2. A lithographic apparatus according to claim 1, further comprising an exchangeable dummy pellicle that matches a size and shape of the pellicle of the reticle at least in directions parallel to the exposed surface of the pellicle, to serve as said flow reducer for selected reticles.

3. A lithographic apparatus according to claim 1, wherein the flow reducer extends from a wall of the reticle preparation chamber in a direction that is substantially perpendicular to the surface of the reticle.

4. A lithographic apparatus according to claim 1, further comprising a sensor for measuring a pellicle deformation and/or pressure in the reticle preparation chamber during application of the evacuating pressure, and a control circuit arranged to control evacuation of the reticle preparation chamber based on the measured pellicle deformation and/or pressure.

5. A lithographic apparatus according to claim 1, wherein the purge gas pressure and evacuating pressure supply arrangement comprises a control circuit arranged to regulate a rate and/or duration of an evacuation of the reticle preparation chamber to below a predetermined rate and/or duration.

6. A lithographic apparatus according to claim 1, wherein the reticle exchange unit is arranged to move the reticle to the reticle preparation chamber while a preceding reticle is on the support.

7. A device manufacturing method comprising:
    conditioning a beam of radiation;
    moving a reticle to a position for imparting the beam of radiation with a pattern in its cross-section, the reticle having a surface that is protected by a pellicle attached to the reticle by a gas permeable pellicle frame;
    projecting the patterned beam of radiation onto a target portion of a substrate;
    placing the reticle relative to a reticle preparation chamber so that a plurality of exposed gas permeable parts of the pellicle frame face an interior of the reticle preparation chamber before the reticle is moved to the position for imparting the beam of radiation with the pattern;
    alternately applying a purge gas pressure and an evacuating pressure that is lower than the purge gas pressure to the reticle preparation chamber when the exposed gas permeable parts of the pellicle frame are facing the interior of the reticle preparation chamber, so that gas flows through the pellicle frame, alternately, into and out of a pellicle space between the pellicle and the reticle, and
    reducing gas flow to and from a space adjacent the pellicle on a side opposite to a pellicle space between the pellicle and the reticle with a flow reducer in said reticle preparation chamber.

8. A device manufacturing method according to claim 7, further comprising exchanging the flow reducer, between purging of successive reticles by another flow reducer selected from a plurality of flow reducers, based on a next reticle to be purged.

9. A device manufacturing method according to claim 7, further comprising measuring a pellicle deformation and/or pressure in the reticle preparation chamber during an evacuation of the reticle preparation chamber, and controlling said evacuation based on the measured pellicle deformation and/or pressure.

10. A device manufacturing method according to claim 7, further comprising regulating a rate and/or duration of an evacuation of the reticle preparation chamber to below a predetermined rate and/or duration.

11. A device manufacturing method according to claim 7, further comprising using a preceding reticle for imparting the beam of radiation with the pattern in its cross-section while the first mentioned reticle is placed into a reticle preparation chamber or abutting the reticle preparation chamber.

12. A reticle exchange unit for moving a reticle in a lithographic apparatus, the surface of the reticle being protected by a pellicle attached thereto by a gas permeable pellicle frame, the reticle exchange unit comprising:
    a reticle preparation chamber comprising a flow reducer that is arranged to obstruct gas flow to and from a space in the reticle preparation chamber that adjoins an exposed surface of the pellicle that faces away from the reticle;
    a reticle transport unit arranged to cause a plurality of exposed gas permeable parts of the pellicle frame to face an interior of the reticle preparation chamber; and
    a purge gas pressure and evacuating pressure supply arrangement coupled to the reticle preparation chamber and arranged to provide, alternately, a purge gas pressure and an evacuating pressure that is lower than the purge gas pressure to the reticle preparation chamber when the exposed gas permeable parts of the pellicle frame are facing the interior of the reticle preparation chamber, so that gas flows through the pellicle frame, alternately, into and out of a pellicle space between the pellicle and the reticle.

13. A reticle exchange unit according to claim 12, further comprising an exchangeable dummy pellicle that matches a size and shape of the pellicle of the reticle at least in directions parallel to the exposed surface of the pellicle, to serve as said flow reducer for selected reticles.

14. A reticle exchange unit according to claim 12, wherein the flow reducer extends from a wall of the reticle preparation chamber in a direction that is substantially perpendicular to an exposed surface of the reticle.

15. A reticle exchange unit according to claim 12, further comprising a sensor for measuring a pellicle deformation and/or pressure in the reticle preparation chamber during application of the evacuating pressure, and a control circuit arranged to control an evacuation of the reticle preparation chamber based on the measured pellicle deformation and/or pressure.

16. A reticle exchange unit according to claim 12, wherein the purge gas pressure and evacuating pressure supply arrangement comprises a control circuit arranged to regulate a rate and/or duration of an evacuation of the reticle preparation chamber to below a predetermined rate and/or duration.

17. A reticle exchange unit according to claim 12, wherein the reticle exchange unit is arranged to move the reticle to the reticle preparation chamber while a preceding reticle is on the support.

* * * * *